US010818829B2

(12) United States Patent
Jin

(10) Patent No.: US 10,818,829 B2
(45) Date of Patent: Oct. 27, 2020

(54) FLIP-CHIP LIGHT-EMITTING MODULE

(71) Applicant: AZUREWAVE TECHNOLOGIES, INC., New Taipei (TW)

(72) Inventor: Chuan Jin, Hubei (CN)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 16/285,902

(22) Filed: Feb. 26, 2019

(65) Prior Publication Data

US 2020/0185582 A1 Jun. 11, 2020

(30) Foreign Application Priority Data

Dec. 5, 2018 (TW) .............................. 107143698 A

(51) Int. Cl.
| | |
|---|---|
| *H01L 33/62* | (2010.01) |
| *H01L 33/48* | (2010.01) |
| *H01L 33/58* | (2010.01) |
| *H01L 33/64* | (2010.01) |
| *H01L 25/075* | (2006.01) |

(52) U.S. Cl.
CPC ............ *H01L 33/62* (2013.01); *H01L 33/486* (2013.01); *H01L 33/58* (2013.01); *H01L 33/64* (2013.01); *H01L 25/0756* (2013.01)

(58) Field of Classification Search
CPC ....... H01L 33/486; H01L 33/62; H01L 33/64; H01L 33/641; H01L 33/38; H01L 33/58; H01L 2924/01079; H01L 2924/01078

USPC ........ 257/99, 98, 778, 701, 678; 438/22, 25, 438/26, 27, 29
See application file for complete search history.

(56) References Cited

U.S. PATENT DOCUMENTS

| | | | |
|---|---|---|---|
| 2008/0048203 A1* | 2/2008 | Son .................................. 257/98 |
| 2016/0290856 A1 | 10/2016 | Fiederling et al. |
| 2017/0353004 A1 | 12/2017 | Chen et al. |

FOREIGN PATENT DOCUMENTS

| | | | | |
|---|---|---|---|---|
| CN | 209199980 U | * | 11/2018 | ............. H01L 33/48 |
| TW | M568501 U | | 10/2018 | |
| TW | M570522 U | | 11/2018 | |
| WO | 2012124522 A1 | | 9/2012 | |

* cited by examiner

*Primary Examiner* — Thinh T Nguyen
(74) *Attorney, Agent, or Firm* — Li & Cai Intellectual Property (USA) Office

(57) ABSTRACT

A flip-chip light-emitting module includes a main circuit board, a heat dissipation substrate, a package assembly, and a light-emitting chip. The package assembly includes a frame surrounding the heat dissipation substrate and a lens unit disposed in the frame. The frame includes a first conductive path and at least two second conductive paths separated from each other, and the first conductive path and the second conductive paths are electrically connected to the main circuit board. The light-emitting chip is disposed on a heat dissipation substrate including a top conductive contact and a light-emitting surface on the same side of the light-emitting chip. The top conductive contact is electrically connected to the first conductive path through a conductor. The lens unit is provided with at least one light-transmitting conductive layer electrically connected to the at least two second conductive paths.

7 Claims, 13 Drawing Sheets

FLIP-CHIP LIGHT-EMITTING MODULE

This application claims the benefit of priority to Taiwan Patent Application No. 107143698, filed on Dec. 5, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting module, and more particularly to a flip-chip light-emitting module.

BACKGROUND OF THE DISCLOSURE

Human life is inseparable from illumination, and traditional incandescent lamps have gradually been replaced by other light-emitting elements, such as light-emitting diodes, as lighting devices.

SUMMARY OF THE DISCLOSURE

In response to the above-referenced technical inadequacies, the present disclosure provides a flip-chip light-emitting module capable of detecting whether an optical element is detached through a circuit in a circuit board in view of the issues associated with the related art.

In one aspect, the present disclosure provides a flip-chip light-emitting module, including a main circuit board, a heat dissipation substrate, a package assembly, and a light-emitting chip. The package assembly includes a frame surrounding the heat dissipation substrate and a lens unit disposed in the frame. The frame includes a first conductive path and at least two second conductive paths separated from each other, and the first conductive path and the second conductive path are electrically connected to the main circuit board. The light-emitting chip is disposed on the heat dissipation substrate. The light-emitting chip includes a top conductive contact and a light-emitting surface located on the same side. The top conductive contact is electrically connected to the first conductive path through a conductor. The lens unit is provided with at least one light-transmitting conductive layer electrically connected to the at least two second conductive paths.

In one aspect, the present disclosure provides another flip-chip light-emitting module, including a main circuit board, a frame, a lens unit, and a light-emitting chip. The heat dissipation substrate is disposed on the heat dissipation substrate. The frame is disposed on the main circuit substrate. The lens unit is disposed on the frame. The light-emitting chip is disposed on the heat dissipation substrate, and the light-emitting chip includes a top conductive contact and a light-emitting surface on a same side of the light-emitting chip. The frame includes a first conductive path, and at least two second conductive paths that are separated from each other, and the first conductive path and the second conductive path are electrically connected to the main circuit board. The lens unit includes at least one light-transmitting conductive layer, and the at least one light-transmitting conductive layer is electrically connected to the at least two second conductive paths. The first conductive path, the at least two second conductive paths, and the at least one light-transmitting conductive layers are connected in series with each other.

Therefore, one of the beneficial effects of the present disclosure is that the flip-chip light-emitting module provided by the present disclosure can adopt the technical features of "a package assembly including a frame surrounding the heat dissipation substrate and a lens unit disposed on the frame, the frame including a first conductive path and at least two second conductive paths separated from each other, the first conductive path and the second conductive path being electrically connected to the main circuit board" and "the lens unit being provided with at least one light-transmitting conductive layer electrically connected to the at least two second conductive paths", so as to detect whether the light-transmitting conductive layer is turned on, so as to determine whether the optical component is detached and perform corresponding protection measures.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
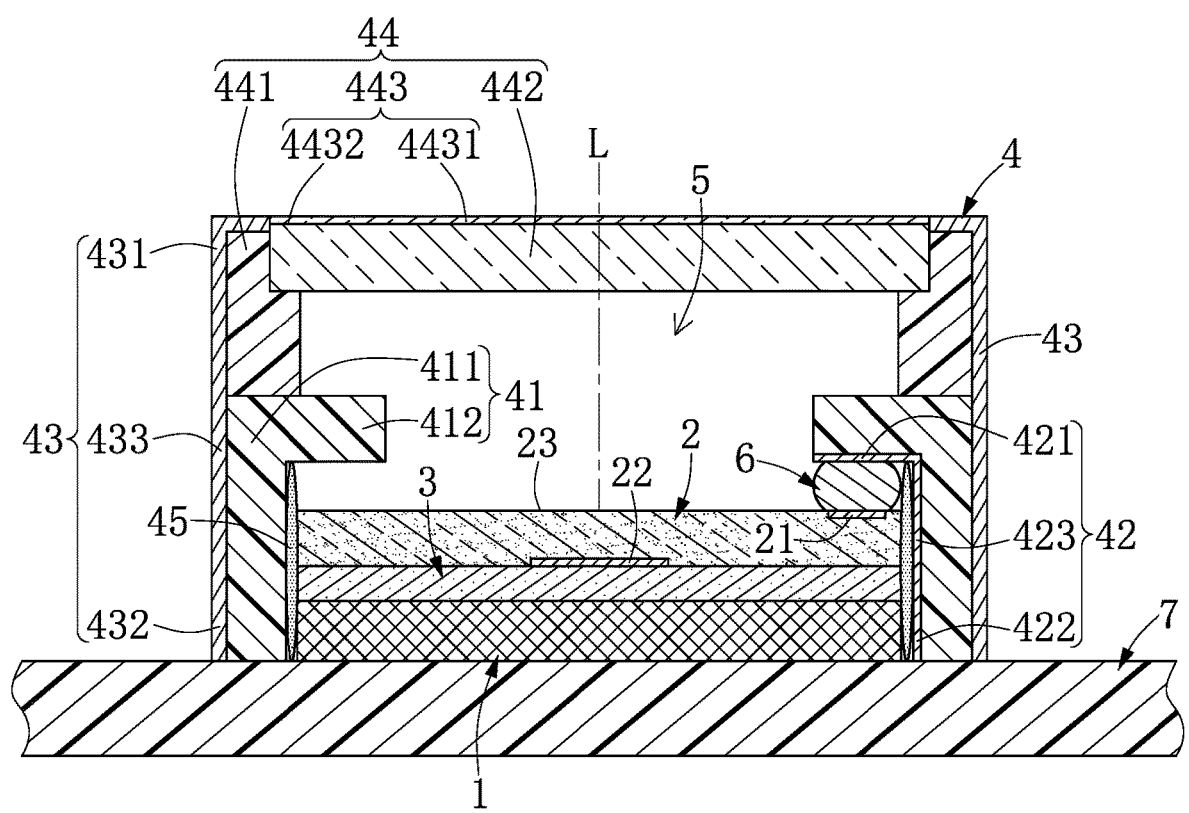
FIG. 1 is a first lateral cross-sectional view according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
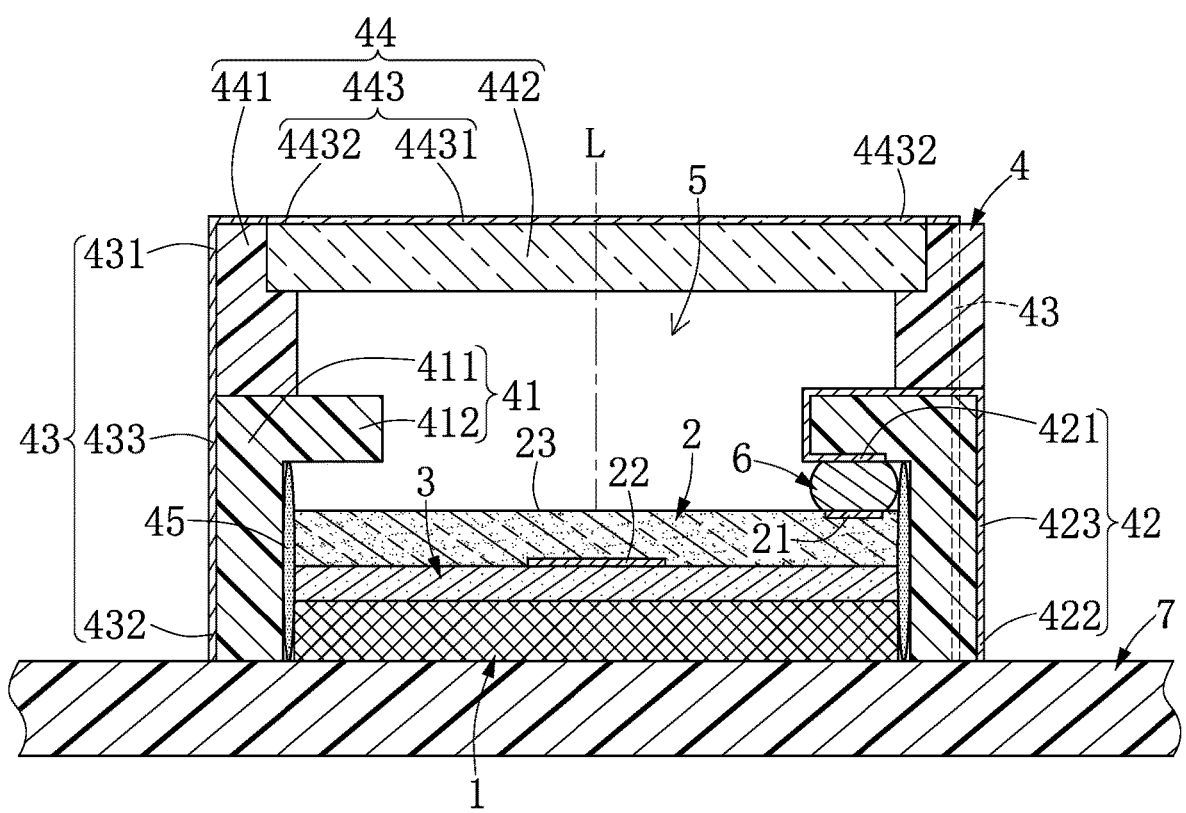
FIG. 2 is a second lateral cross-sectional view according to the first embodiment of the present disclosure, illustrating a first conductive path formed on an outer surface of the frame.

Referring to FIG. 1 to FIG. 2, a first embodiment of the present disclosure provides a flip-chip light-emitting module which is suitable for being mounted to a main circuit board 7 for cooperating with the main circuit board 7. The flip-chip light-emitting module can also be electrically connected to an external power source to be driven. The manner and field of use thereof are not the main subject of the present disclosure and will not be described herein.

Further, the flip-chip light-emitting module of the present disclosure includes a heat dissipation substrate 1, a light-emitting chip 2, a conductive adhesive layer 3, a package assembly 4, a conductor 6, and a main circuit board 7.

The heat dissipation substrate 1 is selected from an aluminum substrate, a copper substrate, or any substrate with heat conduction or heat dissipation capability. One side of the heat dissipation substrate 1 can be electrically connected to the main circuit board 7, and the other side is electrically connected to the light-emitting chip 2.

The light-emitting chip 2 is disposed on the heat dissipation substrate 1 and includes a top conductive contact 21, a bottom conductive contact 22, a light-emitting surface 23, and an optical axis L extending outwardly from the light-emitting surface 23. The top conductive contact 21 and the light-emitting surface 23 are both located on a same side of the light-emitting chip 2 opposite to the heat dissipation substrate 1. The bottom conductive contact 22 is electrically connected to the heat dissipation substrate 1. Preferably, the bottom conductive contact 22 is adhered to the heat dissipation substrate 1 through the conductive adhesive layer 3. The top conductive contact 21 is one of a positive electrode or a negative electrode, and the bottom conductive contact 22 is the other of the positive electrode or the negative electrode. The light-emitting chip 2 is selected from a light emitting diode (LED), a resonant cavity light emitting diode (RCLED), or a vertical cavity laser diode (VCSEL). In the first embodiment, a surface-emitting laser wafer is taken as an example for illustration. However, the above-mentioned examples are only one of the embodiments and are not limited to the present disclosure.

The package assembly 4 defines an optical channel 5 extending along the optical axis L, and includes a frame 41, a first conductive path 42, at least two second conductive paths 43, a lens unit 44, and a filler layer 45. The frame 41 surrounds the heat dissipation substrate 1 and includes a side wall portion 411 surrounding the outside of the heat dissipation substrate 1 and an extension wall portion 412 extending from the side wall portion 411 toward the top conductive contact 21. The extension wall portion 412 and the top conductive contact 21 are opposite to each other. The material of the frame 41 may be a plastic material, a ceramic material or any insulating material, and since the ceramic material has better mechanical strength and heat resistance, the first embodiment uses a ceramic material as an example for illustration. However, the above-mentioned examples are only one of the embodiments and are not limited to the present disclosure.

Figure 3:
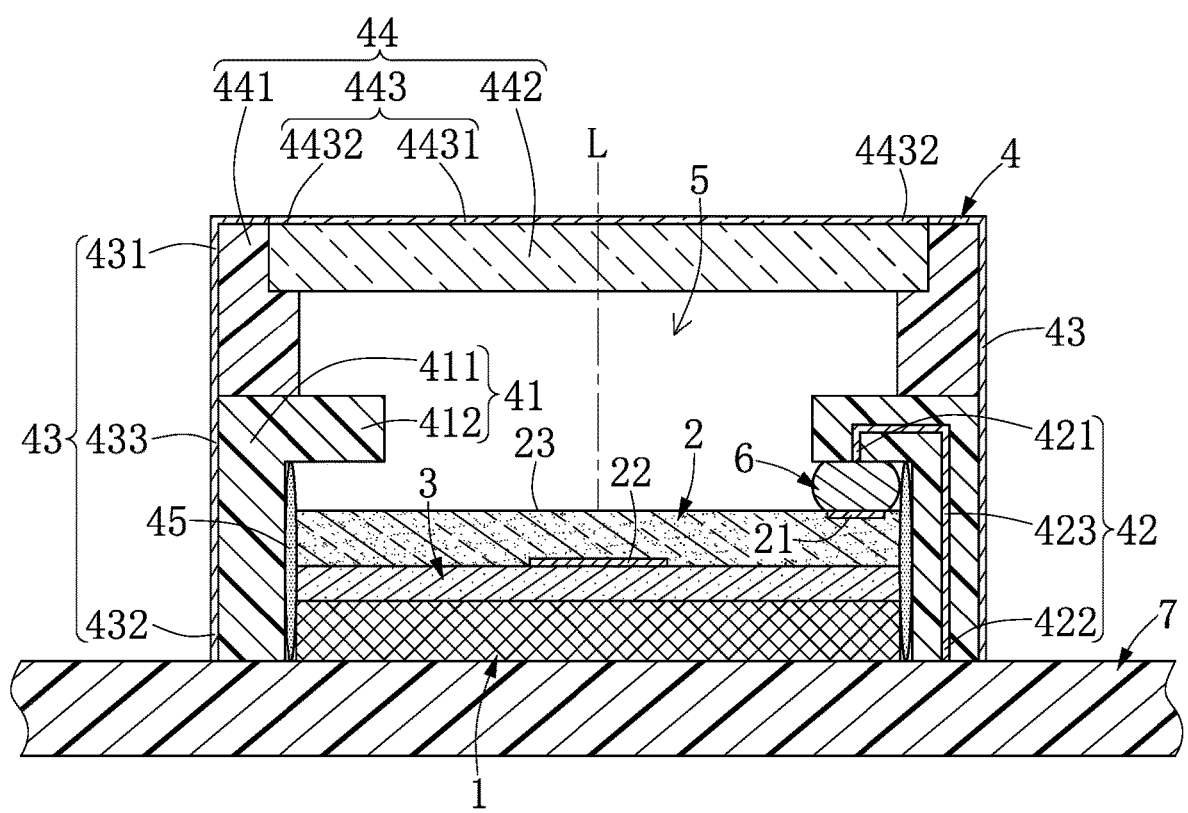
FIG. 3 is a third lateral cross-sectional view according to the first embodiment of the present disclosure, illustrating the first conductive path formed inside the frame.
Figure 4:
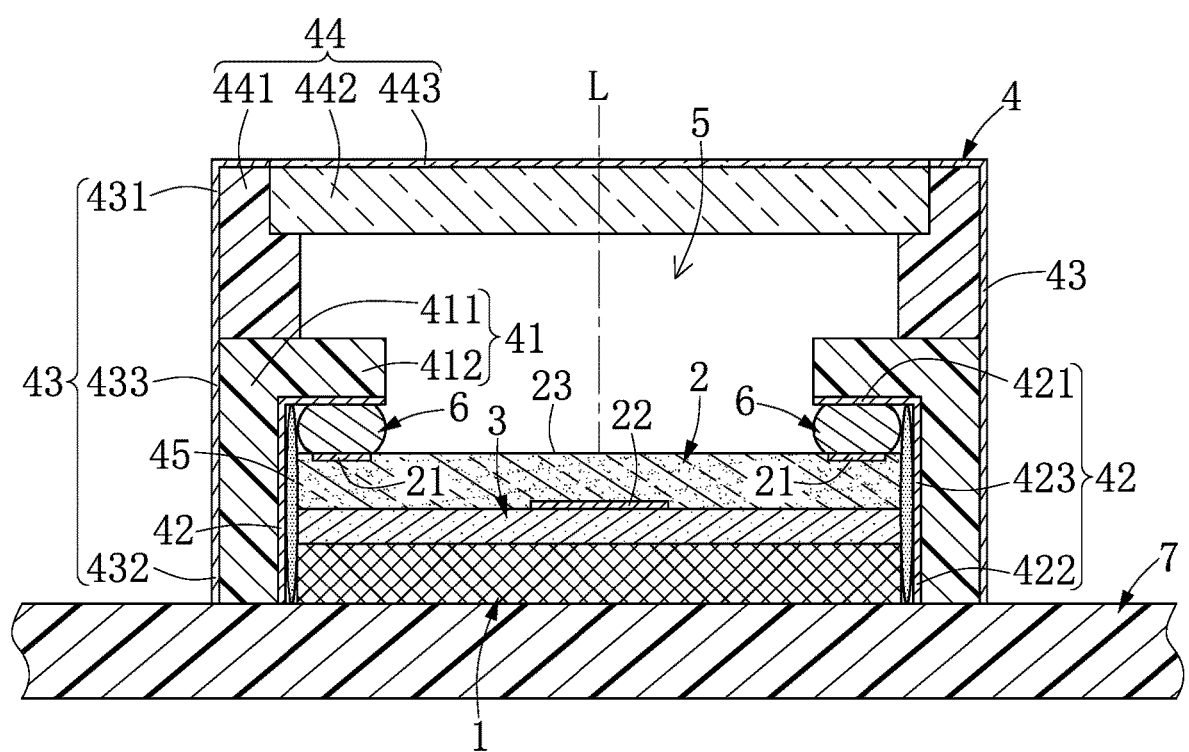
FIG. 4 is a fourth lateral cross-sectional view according to the first embodiment of the present disclosure.

The first conductive path 42 is disposed in the frame 41 and includes a first outer connection end 421, a first inner connection end 422, and a first path 423 extending between the first outer connection end 421 and the first inner connection end 422. The first outer connection end 421 is located in the side wall portion 411 of the frame 41 and is used to electrically connect with the main circuit board 7 or an external component. The first inner connection end 422 is located at the extension wall portion 412 of the frame 41 and is used to electrically connect to the top conductive contact 21. The first path 423 is disposed in the frame 41, and may be formed on the inner surface of the frame 41 (as shown in FIG. 2), on the outer surface of the frame 41 (as shown in FIG. 3), or embedded in an inner portion of the frame 41 (FIG. 4). In the present embodiment, the first path 423 is disposed on the inner surface of the frame 41. The first conductive path 42 can be a wire, a metal dome, or the like having conductive property. The first embodiment adopts a wire as an example. However, the above-mentioned examples are only one of the embodiments and are not limited to the present disclosure.

Figure 11:
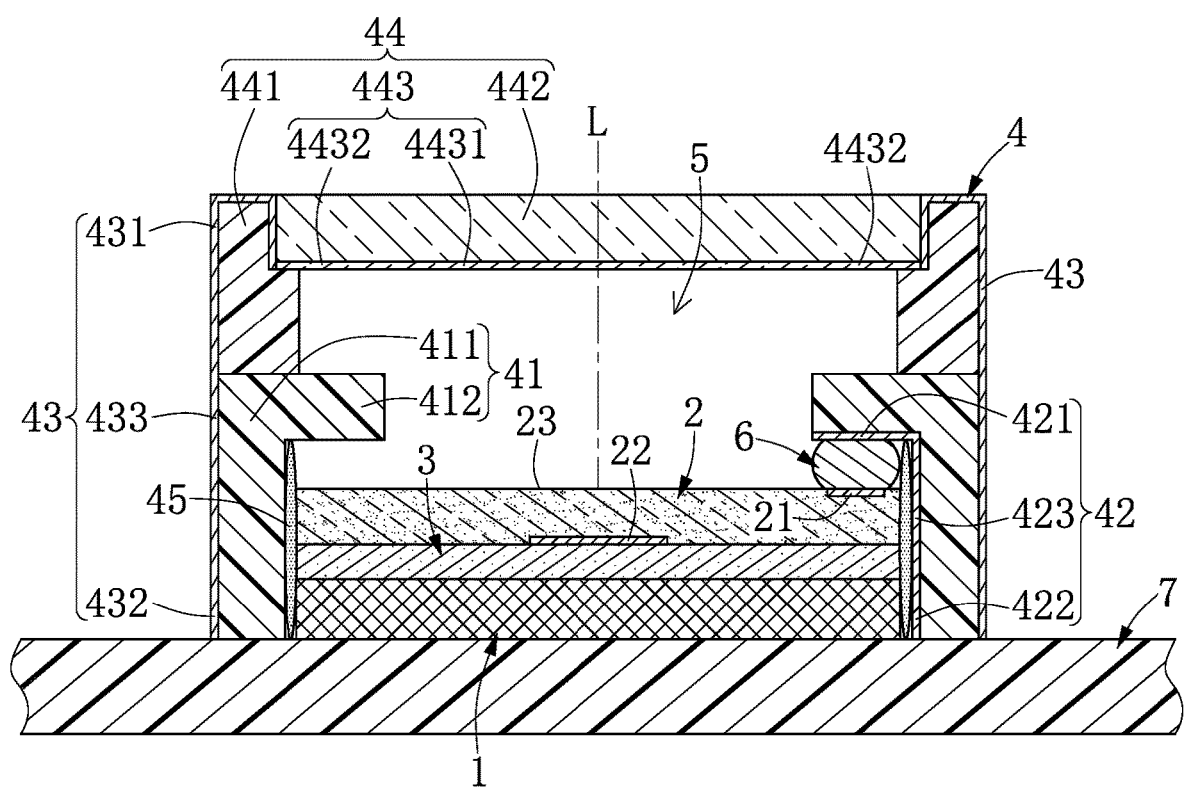
FIG. 11 is a first lateral cross-sectional view according to a fifth embodiment of the present disclosure.

The at least two second conductive paths 43 may be disposed on the frame 41 and the lens unit 44. The at least two second conductive paths 43 may be separated from each other, that is, the two second conductive paths 43 may be separated from each other, and each of the second conductive paths 43 can also be separated into two parts according to the design of the frame 41 and a holder 441 of the lens unit 44, but the present disclosure is not limited thereto. The second conductive path 43 can also be formed after the assembly of the frame 41 and the holder 441 is completed. Each of the second conductive paths 43 may include a second outer connection end 431, a second inner connection end 432, and a second path 433 extending between the second outer connection end 431 and the second inner connection end 432. The second outer connection end 431 is located at the holder 441 of the lens unit 44. The second inner connection end 432 is located at the frame 41 and is used to electrically connect with the main circuit board 7 or an external component. The second path 433 is disposed at the frame 41 and the holder 441, and may be formed on the outer surface of the frame 41 and the holder 441 (as shown in FIG. 2) or embedded in the frame 41 and the holder 441 (FIG. 11). When the second path 433 and the first path 423 are formed on the outer surface of the frame 41, the second path 433 is not in electrical contact with the first conductive path 42 (see FIG. 3). In the present embodiment, the second path 433 is disposed on the outer surface of the frame 41 and the holder 441. The second conductive path 43 can be a wire, a metal dome, or the like having conductive property. The first embodiment adopts a wire as an example. However, the above-mentioned examples are only one of the embodiments and are not limited to the present disclosure.

The lens unit 44 is disposed in the frame 41 and includes a holder 441, a lens 442, and at least one light-transmitting conductive layer 443. The holder 441 is made of an opaque material, extends from the frame 41 along the optical axis L, and defines an optical channel 5 around the optical axis L together with the frame 41. The manner in which the holder 441 is mounted to the frame 41 is not limited, and any manner allowing the former to be mounted to the latter, or vice versa, may be adopted. In the first embodiment, an adhesive is used to bond the two as an example for illustration. Further, the holder 441 further has a plurality of grooves formed by the outer wall surface of the holder 441 body or the inner and outer wall surfaces, and can be used for arranging the second conductive path 43. The lens 442 is disposed in the holder 441 and is located in the optical channel 5, wherein the lens unit 44 can be rectangular, but is not limited thereto. The lens 442 can be a flat type lens, a concentrating type lens, an astigmatic type lens, and other types of lenses. The lens 442 can be made of transparent plastic or glass. The transparent plastic may be selected from the group consisting of polymethylmethacrylate (PMMA), polycarbonate (Polycarbonate, PC), polyetherimide (PEI), Cyclic Olefin copolymer (COC), or the mixture of the above-mentioned etc. In the first embodiment, the lens 442 is a flat type lens 442, and the material thereof is glass as an example. However, the above-mentioned structures and materials are selected as examples only and are not limited thereto.

It should be noted that the number of lens 442 in the lens unit 44 can be two or more, and the types or materials used can be the same or different, depending on the practical requirements.

Figure 7:
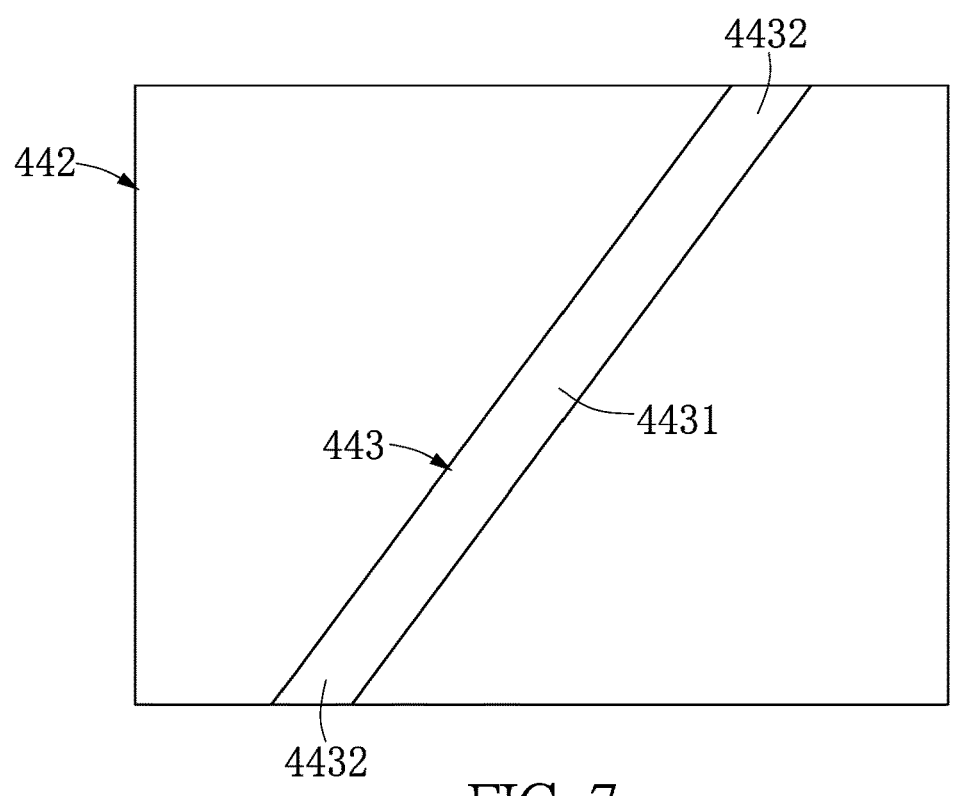
FIG. 7 is a schematic diagram of a second aspect of the light-transmitting conductive layer of the present disclosure.
Figure 8:
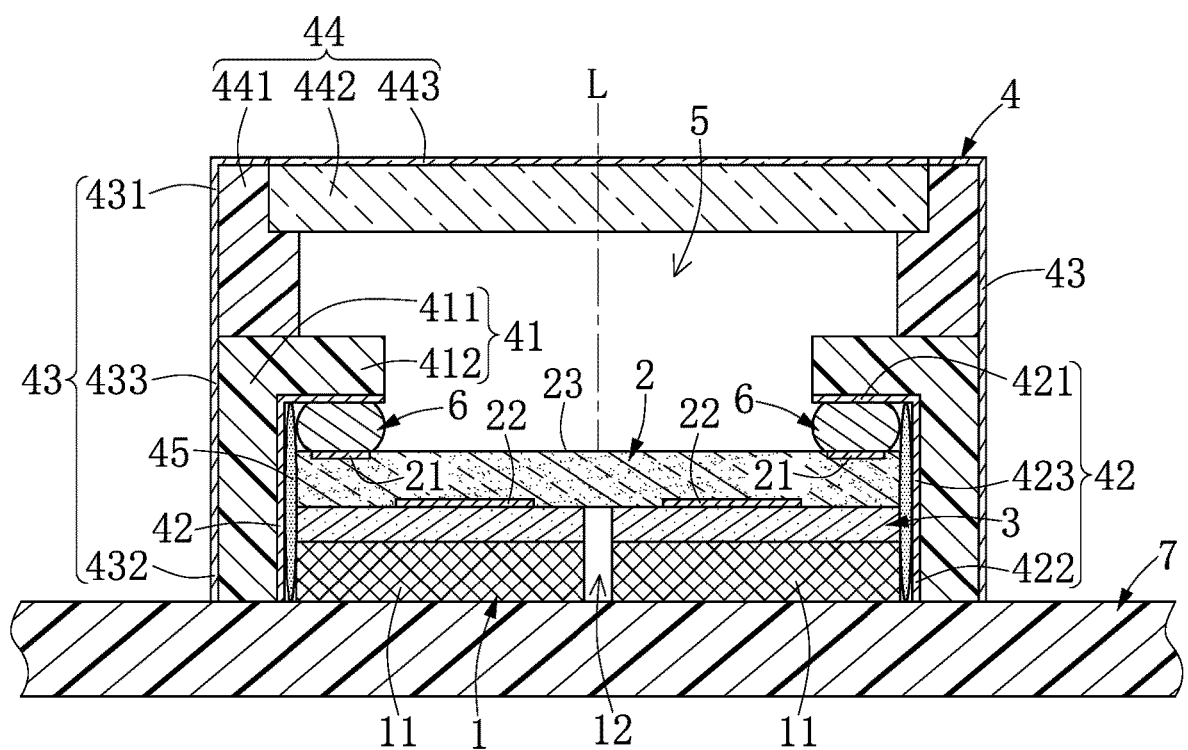
FIG. 8 is a first lateral cross-sectional view according to a second embodiment of the present disclosure.

The at least one light-transmitting conductive layer 443 extends from a corner adjacent to the lens 442 to a position adjacent to the opposite corner thereof. The light-transmitting conductive layer 443 includes a main section 4431 and a plurality of conductive ends 4332. The main section 4431 of the light-transmitting conductive layer 443 may be located on the upper surface or the lower surface of the lens 442, and in the first embodiment, the upper surface of the lens 42 is taken as an example. The main section 4431 may be in an S shape (as shown in FIG. 7) or a long strip shape (as shown in FIG. 8). In the first embodiment, the S shape is taken as an example, but the present disclosure is not limited thereto. The plurality of conductive ends 4332 are electrically and respectively connected to each of the second conductive paths 43. The plurality of conductive ends 4332 can be located on the same side as the main section 4431 (as shown in FIG. 2) or on the lateral side of the lens 442 (as shown in FIG. 11), as long as they can be electrically connected to the second outer connection end 431 of the second conductive path 43. In the first embodiment, the upper surface of the lens 442 is taken as an example. The width of the light-transmitting conductive layer 443 may be greater than, less than or equal to the width of the second conductive path 43, and does not have any limitation. In this embodiment, the width of the light-transmitting conductive layer 443 is smaller than the width of the second conductive path 43 (as shown in the FIG. 1). Moreover, the light-transmitting conductive layer 443 may be made of a material that is transparent and electrically conductive, and the material thereof is selected from, but not limited to, metal, indium tin oxide doped tin ($In_2O_3$: Sn, ITO), tin dioxide doped fluorine ($SnO_2$: F, FTO), tin dioxide doped lanthanum ($SnO_2$: Sb, ATO), and zinc oxide doped aluminum (ZnO: Al, AZO). When a metal is adopted, the thickness thereof is required to be less than 10 nm, and the material may, for example, be gold, silver, platinum, copper, aluminum, chromium, palladium or rhodium, but is not limited thereto. In the first embodiment, tin (ITO) doped with indium trioxide is exemplified as the material used. However, the above-mentioned structures and materials are selected as examples only and are not limited thereto.

The filler layer 45 is disposed on the inner side of the frame 41 and connected to the heat dissipation substrate 1 and the light-emitting chip 2. Therefore, the filler layer 45 is filled in the gap formed between the frame 41 and the heat dissipation substrate 1 and the light-emitting chip 2 for a more stable bonding therebetween, thereby improving the structural strength of the entire flip-chip light-emitting module of the present disclosure. However, the above-mentioned examples are only one of the embodiments and are not limited to the present disclosure.

The conductor 6 is disposed between the light-emitting chip 2 and the package assembly 4, and electrically connects the first conductive path 42 to the top conductive contact 21 of the light-emitting chip 2. The conductor 6 is a solder ball and is sandwiched between the extension wall portion 412 of the frame 41 and the top conductive contact 21 of the light-emitting chip 2, so that after remelting, the first conductive path 42 located on the extension wall portion 412 is electrically connected to the top conductive contact 21. However, the above-mentioned examples are only one of the embodiments and are not limited to the present disclosure.

Through the structural design of the package assembly 4, the light-emitting chip 2 can be assembled by the flip-chip packaging technique, and the assembly process is relatively simple, which can effectively improve the manufacturing speed and increase the production capacity. Moreover, this method can also eliminate the disadvantage that the wire bonding needs to reserve space for the electrical connection of the wire, can effectively reduce the volume of the flip-chip light-emitting module, and is beneficial to applications in miniaturized products.

Figure 5:
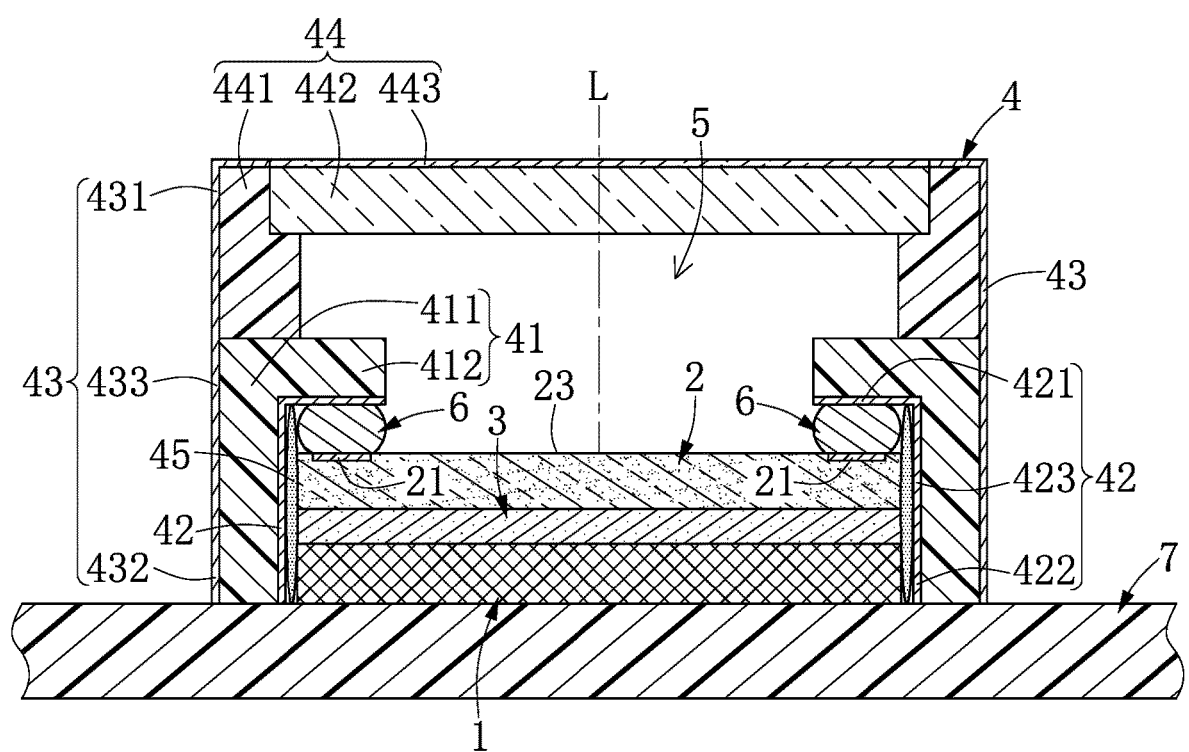
FIG. 5 is a fifth lateral cross-sectional view according to the first embodiment of the present disclosure.
Figure 6:
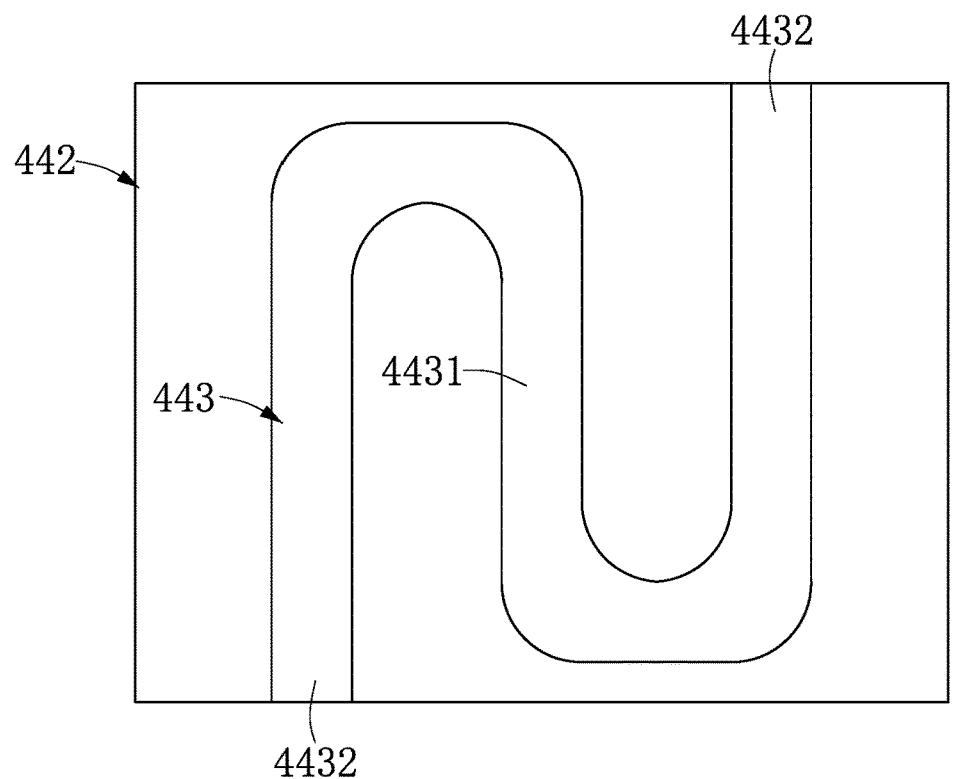
FIG. 6 is a schematic diagram of a first aspect of a light-transmitting conductive layer of the present disclosure.

It is should be noted that, depending on the orientation of the top conductive contact 21 and the bottom conductive contact 22 of the light-emitting chip 2, the wiring in the package assembly 4 is adjusted accordingly. As shown in FIG. 5, in another aspect of the first embodiment, the light-emitting chip 2 further includes another top conductive contact 21, the top conductive contacts 21 are respectively located on opposite sides of the light-emitting surface 23, and the package assembly 4 further includes another first conductive path 42. The flip-chip light-emitting module further includes another conductor 6 electrically and respectively connecting the top conductive contact 21 to the first conductive path 42. In this aspect, the bottom conductive contact 22 is one of a positive or negative electrode, and the top conductive contact 21 is the other of the positive or negative electrode. It should also be noted that one of the top conductive contacts 21 can be used as a conductive contact for transmitting signals. As shown in FIG. 6, in another aspect of the first embodiment, the light-emitting chip 2 does not have a bottom conductive contact 22, but includes two top conductive contacts 21, and at this time, the top conductive contacts 21 respectively function as a positive electrode and a negative electrode. Two corresponding ones of the first conductive paths 42 are present in the package assembly 4, and are electrically and respectively connected to the top conductive contact 21. However, regardless of the configuration of the conductive contacts of the light-emitting chip 2, the structural design of the package assembly 4 enables the light-emitting chip 2 to be assembled by the flip-chip packaging technique, which has the same effect. However, the above-mentioned examples are only one of the embodiments and are not limited to the present disclosure.

In addition, the first conductive path 42, the second conductive path 43 and the light-transmitting conductive layer 443 may be connected in series, but the present disclosure is not limited thereto; that is, the first conductive path 42, the second conductive path 43 and the light-transmitting conductive layer 443 may also be configured to be connected in parallel, however, under this condition, the flip-chip light-emitting module can be provided with a monitoring component or a monitoring circuit on the circuit. When the light-transmitting conductive layer 443 is detected to not be over-powered, the current is stopped from being transmitted to the light-emitting chip 2 to prevent the light-emitting chip 2 from generating a light source.

Accordingly, when the lens 442 is placed on the holder 441, the conductive end 4332 of the light-transmitting conductive layer 443 is electrically and respectively connected to the second outer connection end 431 of the second conductive path 43, and then the second conductive path 43 is electrically connected to the detecting circuit to form a protection circuit. Whether the second conductive path 43 and the light-transmitting conductive layer 443 remain electrically connected or not can be determined by letting the detection circuit detect the resistance or current value in the protection circuit. Thus, when the lens 442 is released and detached from the holder 441, the light-transmitting conductive layer 443 will be disconnected from the second conductive path 43; that is, the circuit is an open-circuit. At this time, the detecting circuit detects that the protection circuit is an open-circuit and cuts off the operation of the driving circuit, and stops the operation of the light-emitting chip 2 to avoid damaging the light-emitting chip 2; or, when the driving circuit of the light-emitting chip 2 is used as the detecting circuit, the light-transmitting conductive layer 443 is separated from the second conductive path 43 to form an open circuit when the protection circuit is connected in series with the driving circuit, at which time the driving circuit is also cut off, so that the operation of the light-emitting chip 2 is stopped.

Through the above description, the advantages of the first embodiment of the present disclosure can be summarized as follows:

1. The circuit in the flip-chip light-emitting module can detect whether the lens 442 is detached by the second conductive path 43 provided on the holder 441, and perform corresponding protection measures.

2. The circuit in the flip-chip light-emitting module can detect whether the lens 442 is detached by detecting whether the light-transmitting conductive layer 443 is turned on, and perform corresponding protection measures.

3. The light-transmitting conductive layer 443 is disposed on the upper surface of the lens 442, which can be used to detect the wear of the lens 442. When a foreign object rubs onto the upper surface of the lens 442, the foreign object will simultaneously rub onto the light-transmitting conductive layer 443. Thus, if the lens 442 encounters excessive friction, the light-transmitting conductive layer 443 may easily be rubbed off from the lens 442, causing the protection circuit to be in an open-circuit state and thereby stopping the operation of the light-emitting chip 2.

4. The light-transmitting conductive layer 443 is in an S-shape, which can ensure that the light-transmitting conductive layer 443 covers the entire surface of the lens 442, such as a corner, a periphery, a center, etc., so that through this configuration, it can be ensured that when the foreign object rubs the lens 442, the foreign object would also rub the light-transmitting conductive layer 443 to improve the detection ability of the wear of the lens 442.

5. When the conductive end 4332 of the light-transmitting conductive layer 443 extends to the lateral side of the lens 442, the structure can increase the contact area with the second conductive path 43 to ensure an effective electrical connection with each other. Therefore, only when the lens 442 is completely or nearly detached from the holder 441 will the light-transmitting conductive layer 443 not be in contact with the second conductive path 43 and cause the protection circuit to be in an open-circuit state. In this way, the second conductive path 43 and the light-transmitting conductive layer 443 can avoid disconnections caused by shakes or jolts, which may result in erroneous judgments.

6. Since the width of the second conductive path 43 is larger than the width of the light-transmitting conductive layer 443, manufacturing deviations will not easily prevent electrical connection between the two when being bonded with each other.

Second Embodiment

Referring to FIG. 8, the second embodiment of the present disclosure is substantially the same as the first embodiment, except that the light-emitting chip 2 includes two top conductive contacts 21 and two bottom conductive contacts 22, and the heat dissipation substrate 1 correspondingly includes two plate elements 11 that are spaced-apart from each other. Two adjacent plate elements 11 together define a heat dissipation channel 12.

The number of plate elements 11 may be two, three, or four or more, and may be adjusted according to practical requirements. In this embodiment, the number of plate elements 11 is two, and the number of heat dissipation channels 12 is one.

As such, the second embodiment of the present disclosure not only provides the advantages of the first embodiment, but also discloses another exemplary structure of the light-emitting chip 2, which includes a plurality of bottom conductive contacts 22. Corresponding to such structure, the heat dissipation substrate 1 can be formed by using only a plurality of plate elements 11, and the heat dissipation channel 12 therein can further improve the heat dissipation effect.

It is should be noted that even if there is only one bottom conductive contact 22, a plurality of plate elements 11 can be used to form the heat dissipation substrate 1; that is, a bottom conductive contact 22 is attached to two or more plate elements 11. The method also enables the heat dissipation substrate 1 to have a conductive function, and the heat dissipation channel 12 can further improve the heat dissipation effect.

However, the above-mentioned examples are only one of the embodiments and are not limited to the present disclosure.

Third Embodiment

Figure 9:
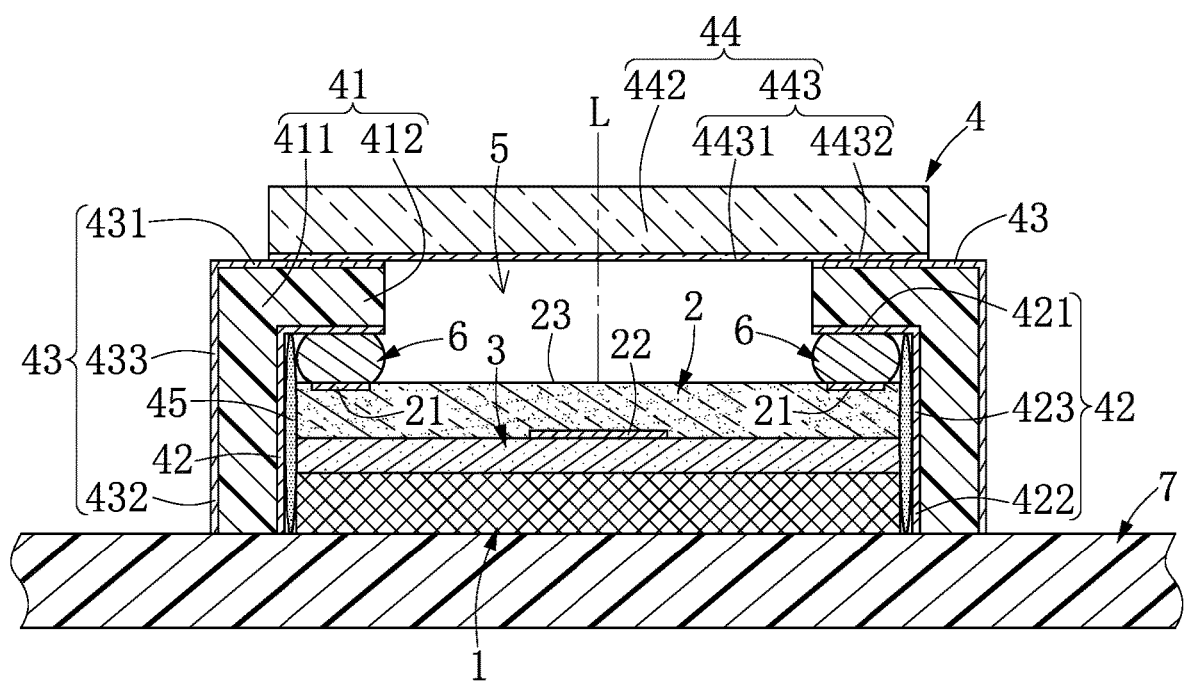
FIG. 9 is a lateral cross-sectional view according to a third embodiment of the present disclosure.

Referring to FIG. 9, the third embodiment of the present disclosure is substantially the same as the first embodiment, except that the lens unit 44 does not include the holder 441 (as shown in FIG. 2), and the lens 442 is directly disposed in the frame 41, that is, the frame 41 also serves the function of the holder 441.

By removing the holder 441 (as shown in FIG. 2), the height of the flip-chip light-emitting module can be reduced so as to further reduce the overall volume. Thus, the third embodiment of the present disclosure not only has the advantages of the first embodiment, but also further reduces the volume of the lens unit 44.

It should be noted that in this embodiment, the light-transmitting conductive layer 443 can be located on the lower surface of the lens 442. Therefore, the plurality of conductive ends 4332 of the light-transmitting conductive layer 443 can be electrically and respectively connected to each of the second conductive paths 43 to detect whether the lens 442 is detached.

In addition, the configuration of the conductive contacts of the light-emitting chip 2 in the third embodiment is the same as that in the first embodiment, and the user can make adjustments according to actual needs without being limited to the present disclosure. However, for convenience of description, the light-emitting chip 2 of the third embodiment of the present disclosure adopts a configuration including two top conductive contacts 21 and a bottom conductive contact 22.

However, the above-mentioned examples are only one of the embodiments and are not limited to the present disclosure.

Fourth Embodiment

Figure 10:
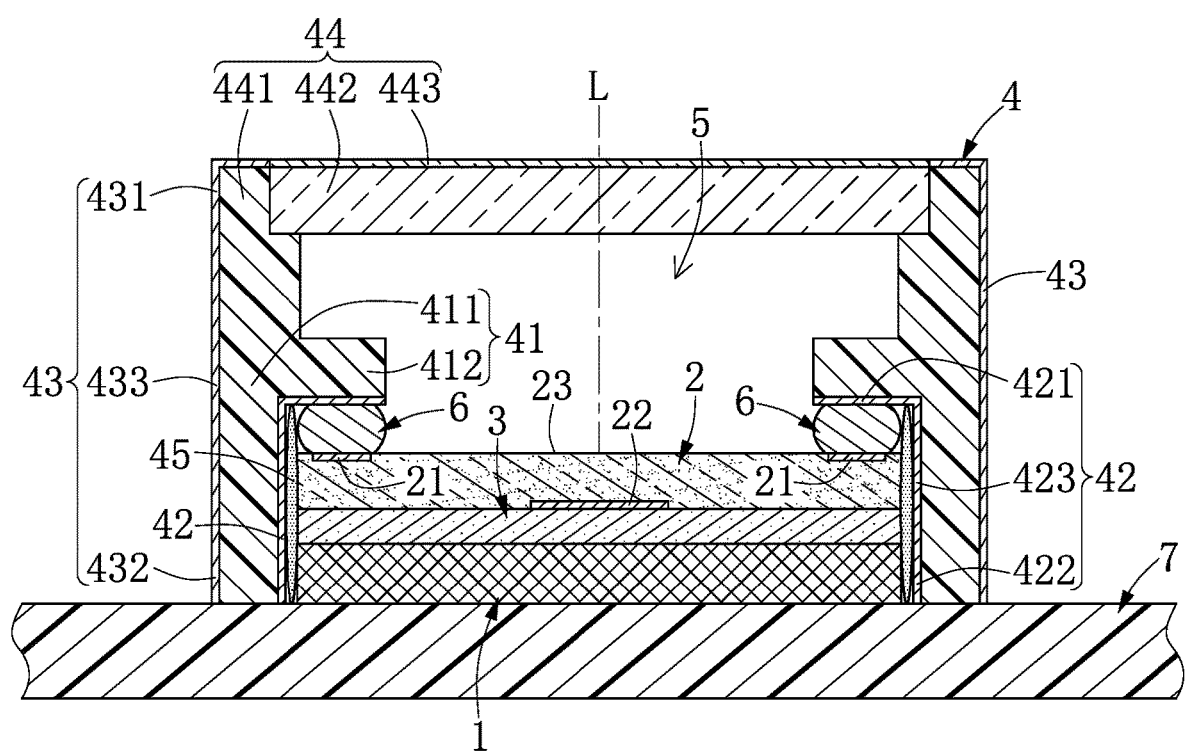
FIG. 10 is a lateral cross-sectional view according to a fourth embodiment of the present disclosure.

Referring to FIG. 10, the fourth embodiment of the present disclosure is substantially the same as the first embodiment, with the main difference being that the holder 441 and the frame 41 are integrally formed.

By integrally forming the holder 441 and the frame 41, there is no need to perform the steps of assembling the holder 441 and the frame 41 in the flip-chip light-emitting module, and the strength of the structure of the package assembly 4 can be further enhanced.

As described above, the fourth embodiment of the present disclosure not only has the advantages of the first embodiment, but further has the advantages of simplifying the manufacturing process and improving the structural strength.

In addition, in the fourth embodiment of the present disclosure, the configuration of the conductive contacts of the light-emitting chip 2 is the same as that in the first embodiment, and the user can make adjustments according to actual needs without being limited to the present disclosure. However, for convenience of description, the light-emitting chip 2 of the fourth embodiment adopts a configuration including two top conductive contacts 21 and one bottom conductive contact 22.

However, the above-mentioned examples are only one of the embodiments and are not limited to the present disclosure.

Fifth Embodiment

Referring to FIG. 11, the fifth embodiment of the present disclosure is substantially the same as the first embodiment. The main difference is that the light-transmitting conductive layer 443 is disposed on the lower surface of the lens 442, and the second outer connection end 431 of the second conductive path 43 extends to the lower surface adjacent to the lens 442. Therefore, the second conductive path 43 can be electrically connected to the light-transmitting conductive layer 443.

Figure 12:
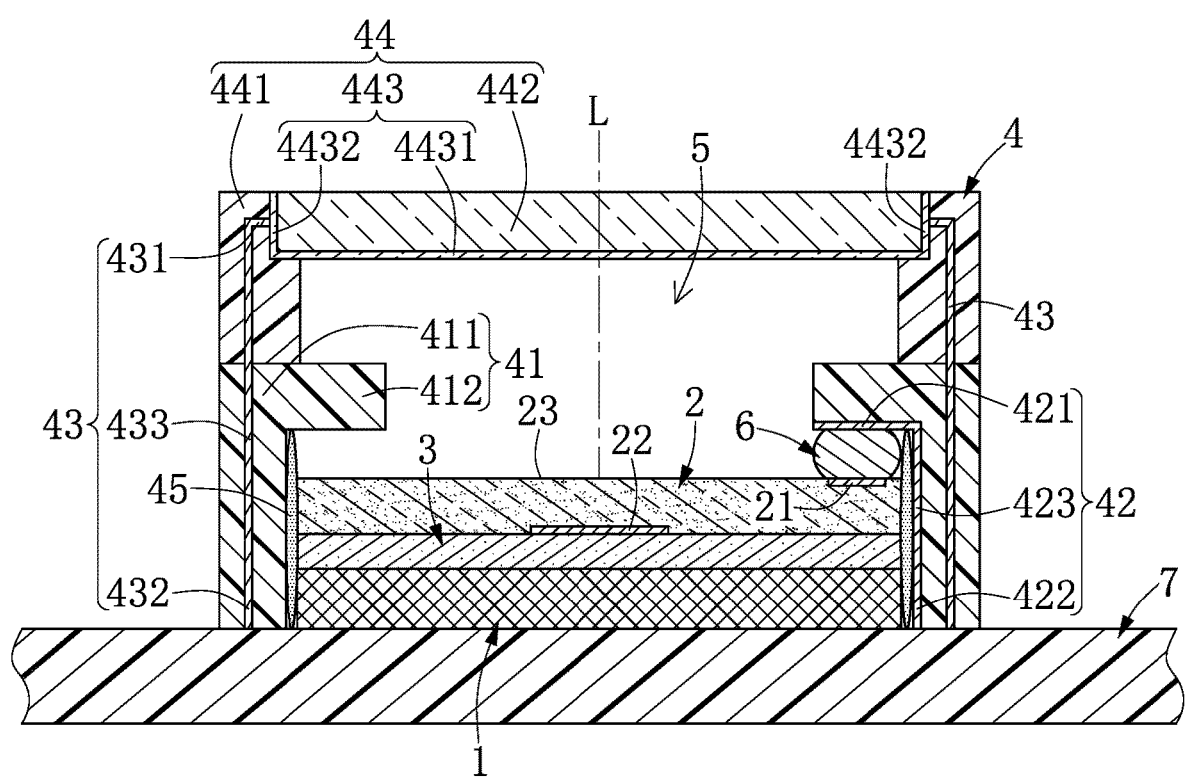
FIG. 12 is a second lateral cross-sectional view according to the fifth embodiment of the present disclosure.

Referring to FIG. 12, in another configuration of the fifth embodiment of the present disclosure, the light-transmitting conductive layer 443 is located on the lower surface of the lens 442, the conductive end 4332 of the light-transmitting conductive layer 443 is extended to the lateral side of the lens 442, and the second conductive path 43 is disposed inside the holder 441.

Further, the manner in which the second conductive path 43 is disposed inside the holder 441 can be adjusted according to the materials and manufacturing processes of the holder 441. When the holder 441 is made of a thermoplastic material, the second conductive path 43 may first be placed in a mold for making the holder 441, and then the second conductive path 43 is coated with a plastic, and further solidified into a holder 441; and when the holder 441 is made of a ceramic material, the second conductive path 43 is first placed in a billet and then the holder 441 and the second conductive path 43 are sintered together so that the second conductive path 43 is buried in the holder 441. However, the above production method can be adjusted according to any conventional method, and is not limited that disclosed above.

Therefore, when the second conductive path 43 is buried inside the holder 441, the second conductive path 43 can avoid being damaged by the friction of a foreign object, and the open-circuit state of the protection circuit can further be confirmed to be caused by detachment of the lens 442 from the holder 441 or by damage of the light-transmitting conductive layer 443, and not by damage of the second conductive path 43 itself.

As described above, in addition to the advantages of the first embodiment, the second embodiment can further ensure the accuracy of detecting whether the lens 442 is separated from the holder 441 or suffering from excessive wear by embedding the second conductive path 43 in the holder 441.

In addition, in the fifth embodiment of the present disclosure, the configuration of the conductive contacts of the light-emitting chip 2 is the same as that in the first embodiment, and the user can make adjustments according to actual needs without being limited to the present disclosure.

However, the above-mentioned examples are only one of the embodiments and are not limited to the present disclosure.

Sixth Embodiment

Figure 13:
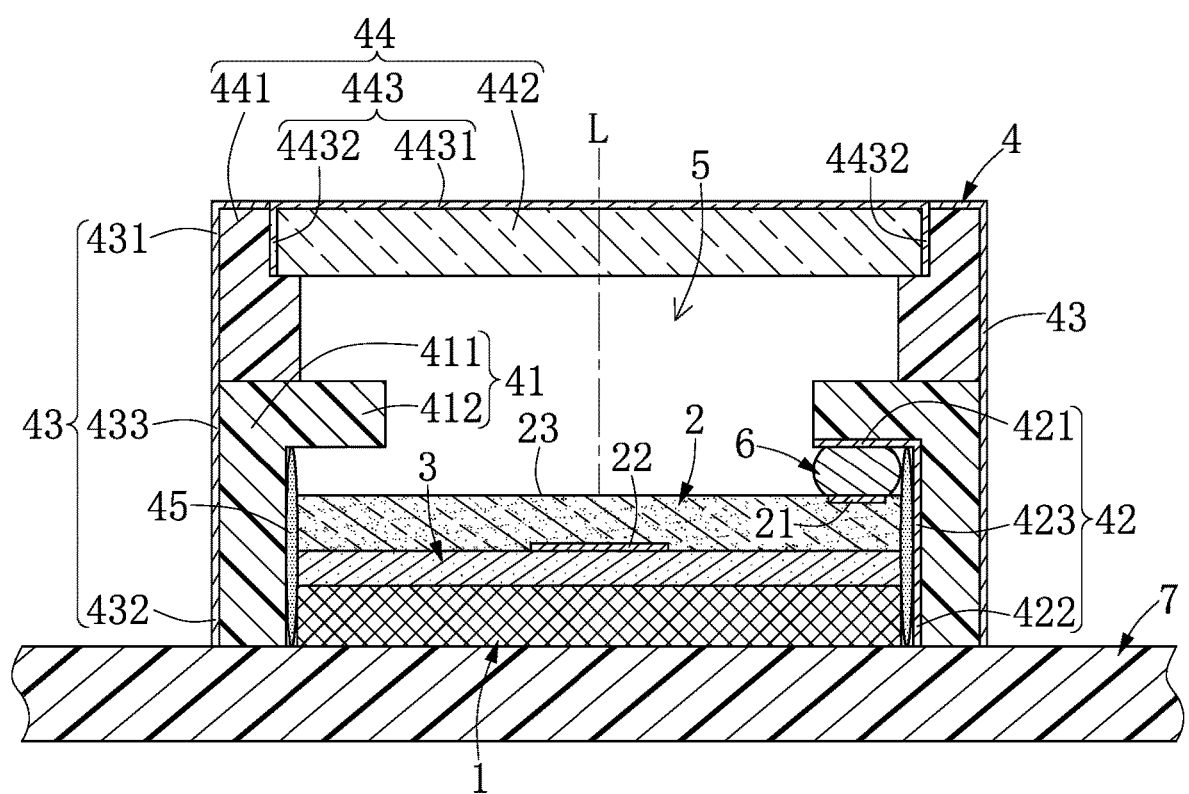
FIG. 13 is a first lateral cross-sectional view according to a sixth embodiment of the present disclosure.

Referring to FIG. 13, the sixth embodiment of the present disclosure is substantially the same as the first embodiment. The main difference is that the conductive end 4332 of the light-transmitting conductive layer 443 extends to the lateral side of the lens 442, and the second outer connection end 431 of the second conductive path 43 extends to the lower surface of the adjacent lens 442.

Figure 14:
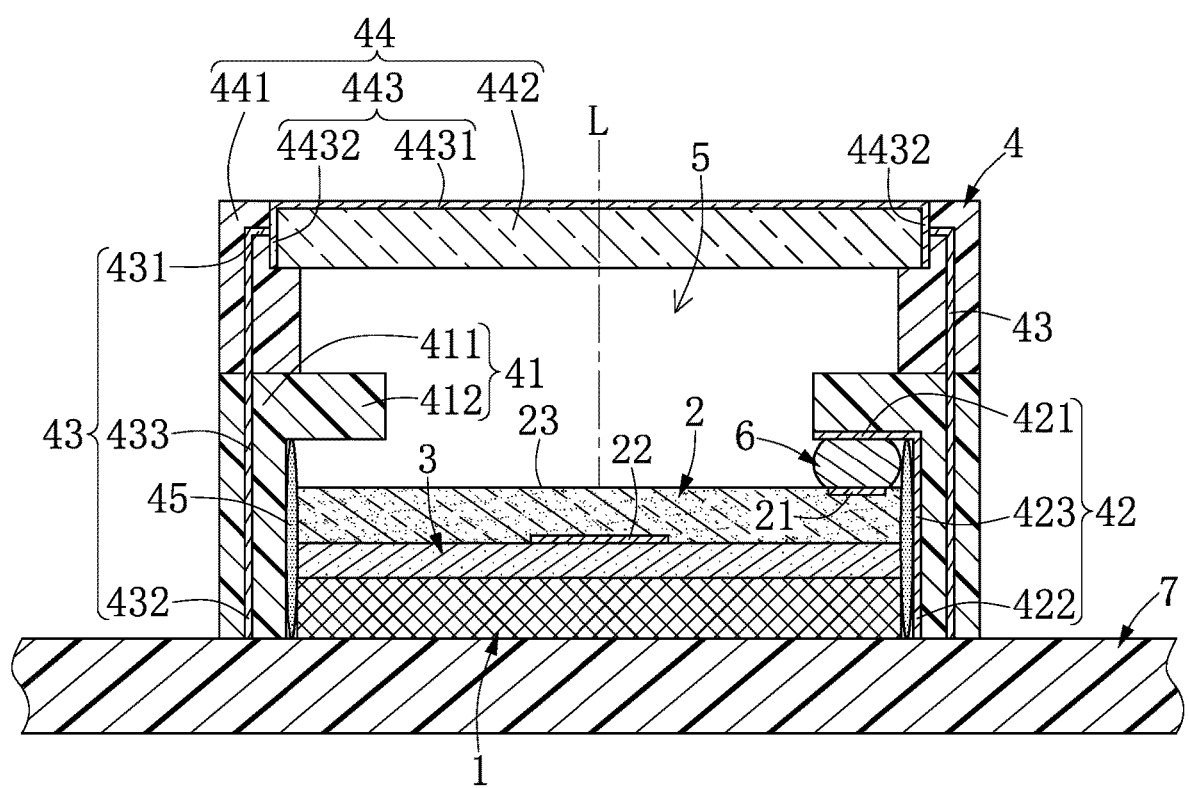
FIG. 14 is a second lateral cross-sectional view according to the sixth embodiment of the present disclosure.

Referring to FIG. 14, in another configuration of the sixth embodiment of the present disclosure, the second conductive path 43 is disposed inside the holder 441, and the second conductive path 43 is disposed in the same manner as that in the another configuration of the fifth embodiment, and will not be described in detail herein.

As described above, in addition to the advantages of the first embodiment, the sixth embodiment of the present disclosure can further ensure the accuracy of detecting whether the lens 442 is separated from the holder 441 or suffering from excessive wear by embedding the second conductive path 43 in the holder 441.

In addition, in the sixth embodiment of the present disclosure, the configuration of the conductive contacts of the light-emitting chip 2 is the same as that in the first embodiment, and the user can make adjustments according to actual needs without being limited to the present disclosure.

However, the above-mentioned examples are only one of the embodiments and are not limited to the present disclosure.

In conclusion, the flip-chip light-emitting module provided by the present disclosure can adopt the technical features of "a package assembly 4 including a frame 41 surrounding the heat dissipation substrate 1 and a lens unit 44 disposed on the frame 41; the frame 41 including a first conductive path 42 and at least two second conductive paths 43 separated from each other; the first conductive path 42 and the second conductive path 43 being electrically connected on the main circuit board 7" and "the lens unit 44 being provided with at least one light-transmitting conductive layer 443 electrically connected to at least two second conductive paths 43", so as to detect whether the light-transmitting conductive layer 443 is turned on and to further determine whether the lens 442 is detached and then perform corresponding protection measures.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A flip-chip light-emitting module, comprising:
a main circuit board;
a heat dissipation substrate disposed on the main circuit board;
a package assembly including a frame surrounding the heat dissipation substrate and a lens unit disposed on the frame, the frame including a first conductive path and at least two second conductive paths separated from each other, and the first conductive path and the second conductive paths being electrically connected to the main circuit board; and
a light-emitting chip disposed on the heat dissipation substrate and including a top conductive contact and a light-emitting surface located on the same side of the light-emitting chip, the top conductive contact being electrically connected to the first conductive path through a conductor;
wherein the lens unit is provided with at least one light-transmitting conductive layer electrically connected to the at least two second conductive paths.

2. The flip-chip light-emitting module according to claim 1, wherein the frame includes a side wall portion surrounding the outside of the heat dissipation substrate and an extension wall portion extending from the side wall portion toward the top conductive contact, the first conductive path including a first outer connection end located in the side wall portion and a first inner connection end located in the extension wall portion, and being electrically connected to the top conductive contact through the conductor; wherein the first conductive path further includes a first path extending between the first outer connection end and the first inner connection end, and the first path is located in one of an inner surface, an outer surface, and an inner portion of the frame.

3. The flip-chip light-emitting module according to claim 1, wherein the light-emitting chip further includes an optical axis extending outward from the light-emitting surface, the lens unit further includes a lens and a holder disposed in the frame, the holder and the frame define an optical channel around the optical axis, and the lens is disposed in the holder and is located in the optical channel; wherein the holder and the frame are integrally formed.

4. The flip-chip light-emitting module according to claim 1, wherein the package assembly further includes a filler layer filled between the frame and the heat dissipation substrate.

5. The flip-chip light-emitting module according to claim 1, wherein the frame of the package assembly is made of a ceramic material, the light-emitting chip is selected from a light-emitting diode, a cavity light-emitting diode, or a surface-emitting laser chip, the conductor is a solder ball, and the first conductive path is a wire.

6. The flip-chip light-emitting module according to claim 1, wherein the lens unit is in a shape of a rectangle, and the light-transmitting conductive layer extends from a corner adjacent to the lens unit to a position adjacent to an opposite corner of the corner adjacent to the lens unit; wherein the light-transmitting conductive layer is in one of an S shape and an elongated shape, and a width of the second conductive path is greater than a width of the transparent conductive layer.

7. A flip-chip light-emitting module, comprising:
a main circuit board;
a heat dissipation substrate disposed on the main circuit board;
a frame disposed on the main circuit board;
a lens unit disposed on the frame; and
a light-emitting chip disposed on the heat dissipation substrate including a top conductive contact and a light-emitting surface located on the same side of the light-emitting chip;
wherein the frame includes a first conductive path and at least two second conductive paths, and the first conductive path and the at least two second conductive paths are electrically connected to the main circuit board;
wherein the lens unit includes at least one light-transmitting conductive layer, and the at least one light-transmitting conductive layers is electrically connected to the at least two second conductive paths;
wherein the first conductive path, the at least two second conductive paths, and the at least one light-transmitting conductive layer are connected in series with each other.

* * * * *